United States Patent
Tsai et al.

(10) Patent No.: US 7,638,718 B2
(45) Date of Patent: Dec. 29, 2009

(54) ELECTROMAGNETIC SHIELD FOR MOBILE COMMUNICATION DEVICE

(75) Inventors: Shu-Jen Tsai, Taipei Hsien (TW); Long-Fong Chen, Taipei Hsien (TW); Wen-Haw Tseng, Taipei Hsien (TW); Shih-Fang Wong, Taipei Hsien (TW)

(73) Assignee: Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 8 days.

(21) Appl. No.: 11/967,080

(22) Filed: Dec. 29, 2007

(65) Prior Publication Data
US 2009/0101403 A1 Apr. 23, 2009

(30) Foreign Application Priority Data
Oct. 19, 2007 (CN) .................... 2007 1 0202162

(51) Int. Cl.
*H05K 9/00* (2006.01)

(52) U.S. Cl. .................... 174/389; 174/377; 455/575.1; 455/575.7

(58) Field of Classification Search ................. 174/350, 174/377, 389; 361/816, 818; 455/575.1, 455/575.5
See application file for complete search history.

(56) References Cited

U.S. PATENT DOCUMENTS

| | | | |
|---|---|---|---|
| 4,249,033 A * | 2/1981 | Darakjy et al. | 174/16.1 |
| 6,359,216 B1 | 3/2002 | Liu | |
| 6,377,473 B1 | 4/2002 | Huang et al. | |
| 6,818,291 B2 * | 11/2004 | Funkenbusch et al. | 428/336 |
| 7,171,248 B1 | 1/2007 | Brown | |
| 2002/0153149 A1 * | 10/2002 | Okada et al. | 174/35 R |
| 2007/0007036 A1 * | 1/2007 | Hashimoto et al. | 174/381 |

* cited by examiner

*Primary Examiner*—Hung V Ngo
(74) *Attorney, Agent, or Firm*—Frank R. Niranjan

(57) ABSTRACT

An electromagnetic shield is configured for blocking electromagnetic waves in a mobile communication device. The electromagnetic shield includes an organic glass layer and an indium tin oxide layer. The organic glass layer is configured for providing main body of the electromagnetic shield. The indium tin oxide layer is plated on the organic glass layer for blocking the electromagnetic waves.

10 Claims, 5 Drawing Sheets

ELECTROMAGNETIC SHIELD FOR MOBILE COMMUNICATION DEVICE

BACKGROUND

1. Field of the Invention

The present invention generally relates to mobile communication devices, and more particularly to an electromagnetic shield for a mobile communication device.

2. Description of Related Art

Mobile communication devices, such as mobile phones and personal digital assistant (PDA), are widely used in our daily life. These mobile communication devices facilitate our working, living, and playing. However, there are still a number of drawbacks discovered in recent years associated with the mobile communication devices. For example, electromagnetic (EM) waves may interfere with the operation of the other components or circuits in the mobile communication devices, or may threaten the health of the user. Therefore, EM waves shielding is important.

Referring to FIG. 5, a conventional mobile communication device 100 includes a front cover 110, a rear cover 120, a printed circuit board (PCB) 130, and a EM shield 140. The PCB 130 is accommodated in a space enclosed by a combination of the front cover 110 and the rear cover 120. The EM shield 140 is set between the PCB 130 and the rear cover 120. The front cover 110 includes a glass 112 for protecting a display (not shown) set in a front surface of the PCB 130. A radio frequency (RF) transceiver 132 is set in a back surface of the PCB 130 for receiving and transmitting EM waves. The EM shield 140 is positioned corresponding to the RF transceiver 132 in order to block the EM waves from other components and users. The EM shield 140 is made of metal materials, such as iron or tin.

Although the EM shield 140 made of metal materials has a good effect in blocking EM waves, operators need to detach the EM shield when inspecting the RF transceiver 132. However, this removing and replacing of the shield is inconvenient.

Therefore, improvements for a EM shield and a mobile communication device are needed in the industry to address the aforementioned deficiency.

SUMMARY

An electromagnetic shield is configured for blocking electromagnetic waves in a mobile communication device. The electromagnetic shield includes an organic glass layer and an indium tin oxide layer. The organic glass layer is the main body of the electromagnetic shield. The indium tin oxide layer is plated on the organic glass layer for blocking the electromagnetic waves.

Other advantages and novel features of the present invention will become more apparent from the following detailed description of preferred embodiment when taken in conjunction with the accompanying drawings.

DETAILED DESCRIPTION OF THE EMBODIMENTS

Reference will now be made to the drawings to describe a preferred embodiment of the present electromagnetic (EM) shield and a preferred embodiment of the present mobile communication device.

Figure 1:
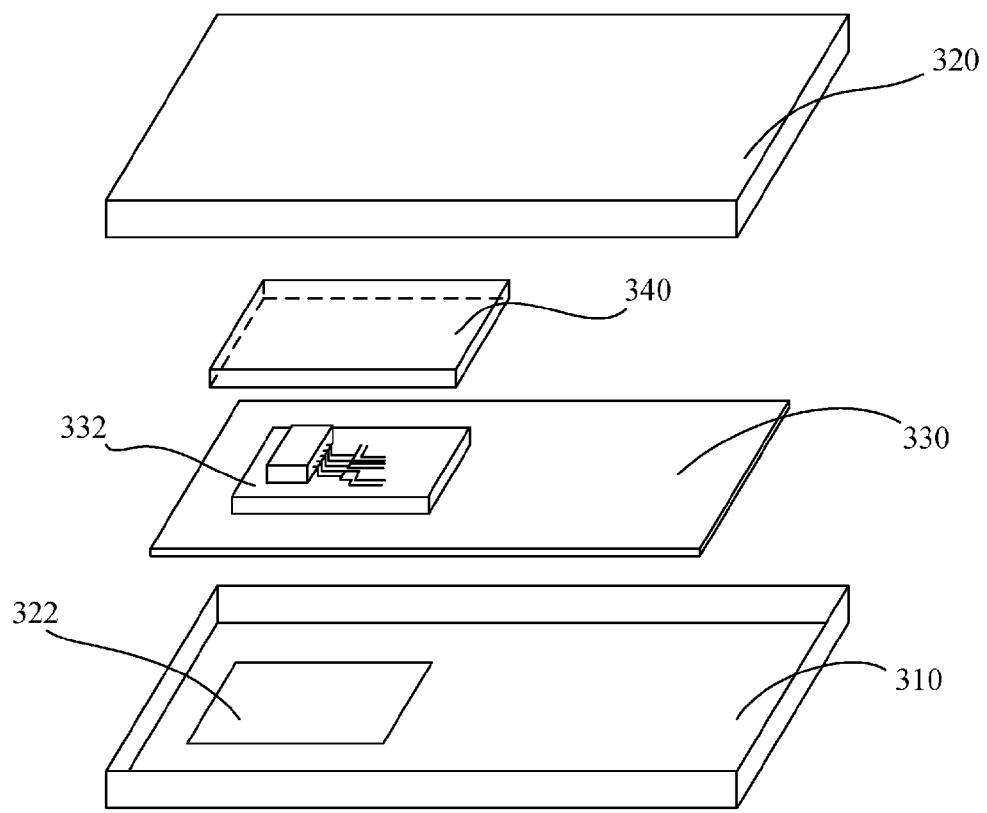
FIG. 1 is a schematic, disassembled diagram showing a mobile communication device in accordance with an exemplary embodiment.

Referring to FIG. 1, a mobile communication device 300 includes a front cover 310, a rear cover 320, a printed circuit board (PCB) 330, and an electromagnetic (EM) shield 340 in accordance with an exemplary embodiment. The PCB 330 is accommodated in a space enclosed by a combination of the front cover 310 and the rear cover 320. The EM shield 340 is set between the PCB 330 and the rear cover 320. The front cover 310 includes a glass 322 for protecting a display (not shown) set in a front surface of the PCB 330. A radio frequency (RF) transceiver 332 is set in a back surface of the PCB 330 for receiving and transmitting EM waves.

Figure 2:
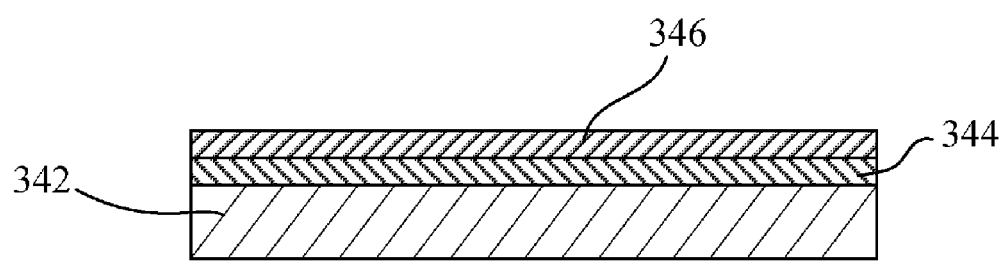
FIG. 2 is a schematic diagram showing an electromagnetic shield of the mobile communication device of FIG. 1.

Referring to FIG. 2, the EM shield 340 is made of indium tin oxide (ITO) glass. The EM shield 340 includes an organic glass layer 342 made of polymethylmethacrylate, a transparent silicon dioxide layer 344, and an ITO layer 346. The organic glass layer 342 is a main supporting part for providing a sufficient structural strength. The silicon dioxide layer 344 is formed between the organic glass layer 342 and the ITO layer 346. If an ITO layer is directly plated onto an organic glass layer, the adhesive strength therebetween is comparative less. Therefore, in the embodiment, the silicon dioxide layer 344 is configured for increasing the adhesive force in the EM shield 340. In another embodiment, an EM shield may only include an organic glass layer and an ITO layer. The ITO layer 346 is configured for blocking the EM waves.

Figure 3:
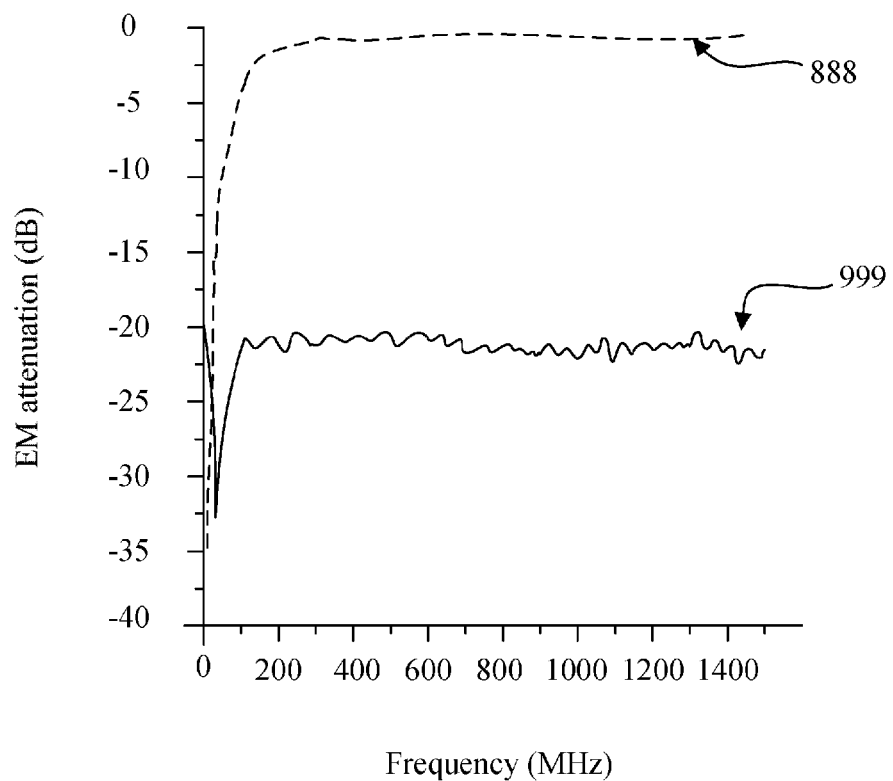
FIG. 3 is a graph showing electromagnetic shielding effects of an ordinary glass and an indium tin oxide glass.

Referring to FIG. 3, an EM shield graph 888 of an ordinary glass shows that the ordinary glass has little effect in blocking EM waves with frequency ranging from 100 MHz to 1500 MHz. Therefore, the EM waves with frequency ranging from 100 MHz to 1500 MHz will pass through the ordinary glass and may interfere with the operation of the electronic components or harmful to users. The graph 999 of an ITO glass EM shield shows that the ITO glass has good effect in blocking EM waves whose frequency ranges from 100 MHz to 1500 MHz. The attenuation of the ITO glass in blocking the aforementioned EM waves can be 20 dB.

Figure 4:
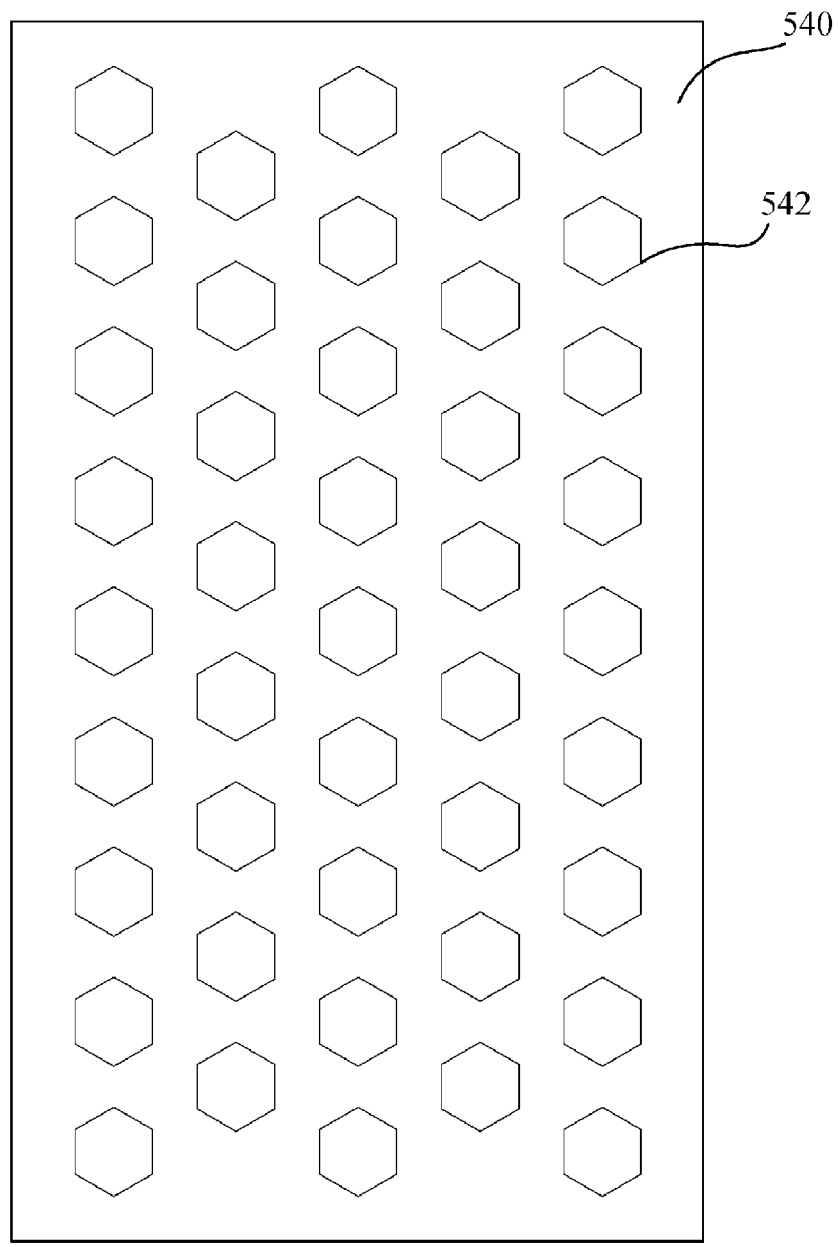
FIG. 4 is a schematic diagram showing a honeycomb mesh of the electromagnetic shield of FIG. 2.
Figure 5:
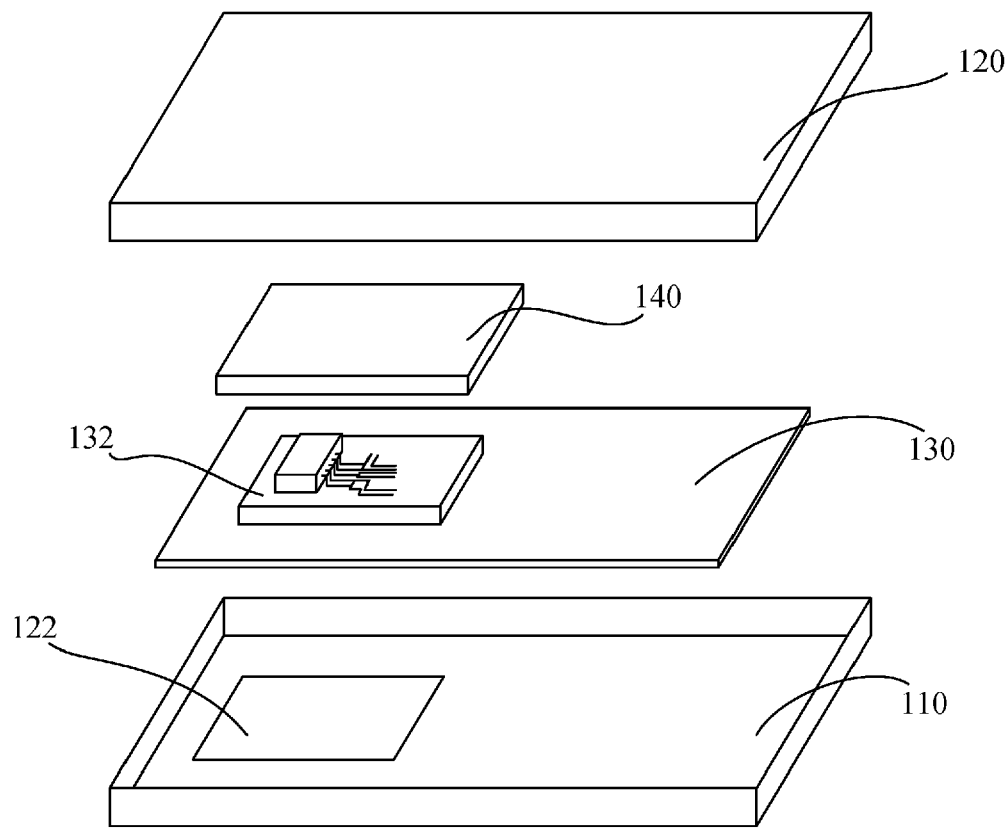
FIG. 5 is a schematic, disassembled diagram showing a conventional mobile communication device.

Furthermore, referring to FIG. 4, the EM shield 340 can also be produced with a plurality of honeycomb holes 542 which constructs a honeycomb mesh to provide an additional heat dissipating function.

Therefore, the EM shield 340 including the ITO layer 346 can obtain a good effect in blocking EM waves. In addition, because the organic glass layer 342, the silicon dioxide layer 344, and the ITO layer 346 are all transparent, the EM shield 340 has good transparent properties. When the RF transceiver 332 needs to be inspected, the EM shield 340 does not need to be detached.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electromagnetic shield for blocking electromagnetic waves, comprising:
   an organic glass layer for providing a main body of the electromagnetic shield;
   an indium tin oxide layer plated on the organic glass layer for blocking electromagnetic waves; and
   a silicon dioxide layer formed between the organic glass layer and the indium tin oxide layer.

2. The electromagnetic shield according to claim 1, wherein the silicon dioxide layer is transparent.

3. The electromagnetic shield according to claim 1, wherein the organic glass layer is made of polymethylmethacrylate.

4. The electromagnetic shield according to claim 1, wherein the indium tin oxide layer is configured for blocking electromagnetic waves whose frequency ranges from 100 MHz to 1500 MHz.

5. The electromagnetic shield according to claim 1, wherein the electromagnetic shield comprises a plurality of honeycomb holes.

6. A mobile communication device comprising:
   a printed circuit board comprising a radio frequency transceiver for receiving or transmitting electromagnetic waves;
   a rear cover covering a rear surface of the printed circuit board; and
   an electromagnetic shield set between the printed circuit board and the rear cover, the electromagnetic shield comprising an organic glass layer for providing a main body of the electromagnetic shield; an indium tin oxide layer plated on the organic glass layer for blocking the electromagnetic waves; and a silicon dioxide layer formed between the organic glass layer and the indium tin oxide layer.

7. The mobile communication device according to claim 6, wherein the silicon dioxide layer is transparent.

8. The mobile communication device according to claim 6, wherein the organic glass layer is made of polymethylmethacrylate.

9. The mobile communication device according to claim 6, wherein the indium tin oxide layer is configured for blocking electromagnetic waves whose frequency ranges from 100 MHz to 1500 MHz.

10. The mobile communication device according to claim 6, wherein the electromagnetic shield comprises a plurality of honeycomb holes constructing a honeycomb mesh.

* * * * *